United States Patent
Lee et al.

(10) Patent No.: US 9,720,066 B2
(45) Date of Patent: Aug. 1, 2017

(54) MAGNETIC RESONANCE IMAGING APPARATUS AND CONTROL METHOD THEREOF

(71) Applicant: SAMSUNG ELECTRONICS CO., LTD., Suwon-si (KR)

(72) Inventors: Dae Ho Lee, Seoul (KR); Seung Je Choi, Suwon-si (KR); Joon Soo Kim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 716 days.

(21) Appl. No.: 14/172,136

(22) Filed: Feb. 4, 2014

(65) Prior Publication Data

US 2014/0218031 A1 Aug. 7, 2014

(30) Foreign Application Priority Data

Feb. 5, 2013 (KR) ........................ 10-2013-0012852

(51) Int. Cl.
G01V 3/00 (2006.01)
G01R 33/565 (2006.01)

(52) U.S. Cl.
CPC ............................ *G01R 33/56518* (2013.01)

(58) Field of Classification Search
CPC ................................................ G01R 33/3664
USPC ........................................................ 324/322
See application file for complete search history.

(56) References Cited

U.S. PATENT DOCUMENTS

| 4,761,612 | A | * | 8/1988 | Holland | G01R 33/028 324/322 |
| 4,965,521 | A | * | 10/1990 | Egloff | G01R 33/56518 324/312 |
| 5,068,786 | A | * | 11/1991 | Netter | G01R 33/543 324/309 |
| 5,451,877 | A | * | 9/1995 | Weissenberger | G01R 33/56518 324/322 |
| 5,455,512 | A | * | 10/1995 | Groen | G01R 33/56518 324/309 |
| 5,770,943 | A | * | 6/1998 | Zhou | G01R 33/56518 324/307 |
| 6,515,478 | B1 | * | 2/2003 | Wicklow | G01R 33/60 324/307 |

(Continued)

FOREIGN PATENT DOCUMENTS

| JP | 5-31091 A | 2/1993 |
| JP | 11-89817 A | 4/1999 |

(Continued)

OTHER PUBLICATIONS

Communication dated Mar. 26, 2014 from the Korean Intellectual Property Office in a counterpart Korean application No. 10-2013-0012852.

*Primary Examiner* — Susan Lee
(74) *Attorney, Agent, or Firm* — Sughrue Mion, PLLC

(57) ABSTRACT

A magnetic resonance imaging apparatus includes a magnetic assembly including a main magnet and a gradient coil unit and forming a static magnetic field and a gradient magnetic field in the bore thereof, and a gradient controller applying a test gradient waveform to the magnetic assembly, and compensating for a distortion of the magnetic field gradients, caused by eddy currents, by reflecting the actual shape of the applied test gradient waveform.

21 Claims, 16 Drawing Sheets

(56) References Cited

U.S. PATENT DOCUMENTS

| | | | | |
|---|---|---|---|---|
| 7,002,343 B2* | 2/2006 | Weissenberger | ... | G01R 33/3875 |
| | | | | 324/309 |
| 2012/0019251 A1* | 1/2012 | Umeda | ............ | G01R 33/56518 |
| | | | | 324/322 |
| 2012/0098535 A1* | 4/2012 | Kaneta | ............. | G01R 33/56518 |
| | | | | 324/307 |
| 2012/0229139 A1* | 9/2012 | Yamanaka | ......... | G01R 33/3852 |
| | | | | 324/318 |

FOREIGN PATENT DOCUMENTS

| | | | | |
|---|---|---|---|---|
| JP | 2002-159464 A | 6/2002 | | |
| JP | WO 2013002232 A1 * | 1/2013 | ............. | G01R 33/24 |

* cited by examiner

MEASUREMENT OF MAGNETIC FIELD GRADIENT

MEASUREMENT OF MAGNETIC FIELD GRADIENT

MAGNETIC RESONANCE IMAGING APPARATUS AND CONTROL METHOD THEREOF

CROSS-REFERENCE TO RELATED APPLICATION

This application claims priority from Korean Patent Application No. 10-2013-0012852, filed on Feb. 5, 2013 in the Korean Intellectual Property Office, the disclosure of which is incorporated herein by reference in its entirety.

BACKGROUND

1. Field

Apparatuses and methods consistent with exemplary embodiments relate to a magnetic resonance imaging (MRI) apparatus and a control method thereof in which a distortion of a gradient magnetic field due to eddy current is compensated for.

2. Description of the Related Art

Magnetic resonance imaging system images the density and physiochemical characteristics of atomic nuclei by generating nuclear magnetic resonance of hydrogen atoms in a human body using a magnetic field which is not harmful to the humans, and radio waves which are a non-ionizing form of radiation.

In more detail, the MRI apparatus images an object by converting energy discharged from atomic nuclei into a signal by supplying a specified frequency and energy to the atomic nuclei in a state in which a specified magnetic field is applied to the bore of a gantry.

In order to execute imaging of the object, a magnetic field gradient is formed within the gantry. The conductors and coils are mounted in the bore of the gantry to form the gradient magnetic field, and when a current pulse is applied to the coils, eddy currents may be generated and thus the gradient magnetic field may be distorted.

Distortion of the magnetic field gradient may be compensated by a method in which a pre-emphasis of a portion of the current pulse which is assumed to be distorted is executed. A pre-emphasis volume, i.e., a compensation volume, is determined by applying a test gradient waveform. In the related art, the compensation volume is determined by assuming that the applied test gradient waveform is the ideal step function. However, the applied gradient waveform differs from the ideal step function due to the physical limitations, and thus, the accuracy of the compensation volume may be compromised.

SUMMARY

Exemplary embodiments may address at least the above problems and/or disadvantages and other disadvantages not described above. Also, the exemplary embodiments are not required to overcome the disadvantages described above, and an exemplary embodiment may not overcome any of the problems described above.

One or more exemplary embodiments provide an MRI apparatus and a control method thereof in which accuracy of compensation is improved by reflecting the shape of an actually applied gradient waveform when distortion of gradient magnetic fields is compensated for.

In accordance with an aspect of an exemplary embodiment, an MRI apparatus includes a magnetic assembly including a main magnet and a gradient magnetic field coil unit and forming a static magnetic field and a gradient magnetic field in the bore thereof, and a gradient controller applying a test gradient waveform to the magnetic assembly, and compensating for distortion of the gradient magnetic field, caused by eddy current, by reflecting the actual shape of the applied test gradient waveform.

The gradient controller may include a compensation function calculator calculating a compensation function to compensate for distortion of the gradient magnetic field by reflecting the actual shape of the applied test gradient waveform.

The compensation function calculator may estimate a system characteristic function of the magnetic assembly from measured values of the gradient magnetic field acquired by applying the test gradient waveform and the actual shape of the applied test gradient waveform.

The compensation function calculator may calculate the compensation function from the estimated system characteristic function.

The measured values of the gradient magnetic field may be measured at plural different echo times.

The gradient controller may further include a compensation circuit in which the calculated compensation function is set and which executes pre-emphasis of the gradient waveform applied to the gradient coil unit.

The compensation function calculator may calculate the inverse function of the estimated system characteristic function as the compensation function.

The compensation function calculator may calculate the compensation function by assuming that the actual shape of the applied test waveform is a ramp function having a finite ramp time.

The gradient controller may apply the test gradient waveform plural times while varying the shape of the test gradient waveform, and the compensation function calculator may calculate the compensation function using the measured values of the gradient magnetic field according to the shape of the test gradient waveform.

The shape of the test gradient waveform may be at least one selected from the group consisting of polarity, amplitude, and ramp time.

The compensation function calculator may estimate the system characteristic function using the measured values of the gradient magnetic field when the test gradient waveform is not applied and the measured values of the gradient magnetic field when the test gradient waveform is applied.

The gradient controller may apply the test gradient waveform while varying the polarity of the test gradient waveform.

The compensation function calculator and the compensation circuit may calculate the compensation function in each of directions of the gradient magnetic field, i.e., the X-axis direction, the Y-axis direction, and the Z-axis direction, and execute pre-emphasis of the gradient waveform in each of these directions.

In accordance with an aspect of an exemplary embodiment, a control method of an MRI apparatus which has a magnetic assembly including a main magnet and a gradient coil unit and forming a static magnetic field and a gradient magnetic field in the bore thereof, includes applying a test gradient waveform to the magnetic assembly, and calculating a compensation function to compensate for distortion of the gradient magnetic field, caused by eddy current, by reflecting the actual shape of the applied test gradient waveform.

The control method may further include measuring values of the gradient magnetic field acquired by applying the test gradient waveform, and the calculation of the compensation function may include using the measured values of the gradient magnetic fields and the actual shape of the applied test gradient waveform.

The calculation of the compensation function may further include estimating a system characteristic function of the magnetic assembly from the measured values of the gradient magnetic fields and the actual shape of the applied test gradient waveform.

The calculation of the compensation function may further include calculating the compensation function from the estimated system characteristic function.

The measured values of the gradient magnetic fields may be measured at plural different echo times.

The control method may further include compensating for distortion of the gradient magnetic field, caused by eddy current, by executing pre-emphasis of the gradient waveform applied to the gradient coil unit using the calculated compensation function.

The calculation of the compensation function may further include calculating the inverse function of the estimated system characteristic function as the compensation function.

In the calculation of the compensation function, the compensation function may be calculated by assuming that the actual shape of the applied test waveform is a ramp function having a finite ramp time.

The application of the test gradient waveform may include applying the test gradient waveform plural times while varying the shape of the test gradient waveform, and the calculation of the compensation function may include calculating the compensation function using the measured values of the gradient magnetic field according to the shape of the test gradient waveform.

The shape of the test gradient waveform may be at least one selected from the group consisting of polarity, amplitude, and ramp time.

The calculation of the compensation function may include estimating the system characteristic function using the measured values of the gradient magnetic field when the test gradient waveform is not applied and the measured values of the gradient magnetic field when the test gradient waveform is applied.

The application of the test gradient waveform may include applying the test gradient waveform while varying the polarity of the test gradient waveform.

BRIEF DESCRIPTION OF THE DRAWINGS

The above and/or other aspects will become more apparent by describing certain exemplary embodiments, with reference to the accompanying drawings, in which.

DETAILED DESCRIPTION

Figure 1:
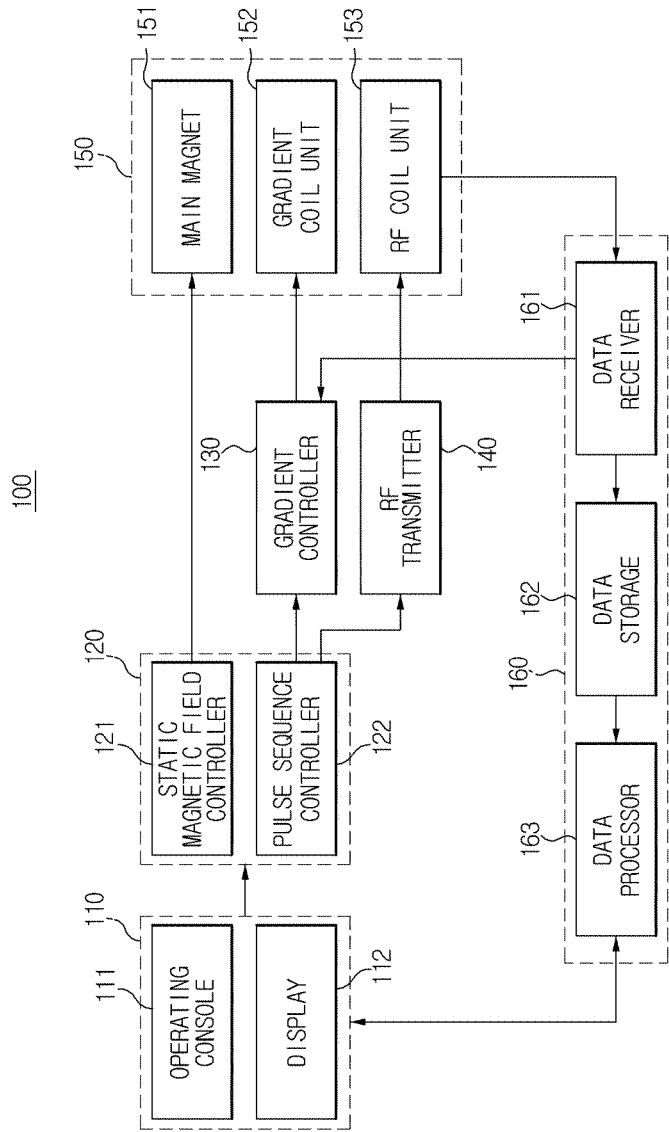
FIG. 1 is a control block diagram of an MRI apparatus in accordance with an exemplary embodiment.

Certain exemplary embodiments are described in greater detail below with reference to the accompanying drawings.

In the following description, the same drawing reference numerals are used for the same elements even in different drawings. The matters defined in the description, such as detailed construction and elements, are provided to assist in a comprehensive understanding of exemplary embodiments. Thus, it is apparent that exemplary embodiments can be carried out without those specifically defined matters. Also, well-known functions or constructions are not described in detail since they would obscure exemplary embodiments with unnecessary detail.

FIG. 1 is a control block diagram of an MRI apparatus in accordance with an exemplary embodiment.

With reference to FIG. 1, the MRI apparatus 100 in accordance with an exemplary embodiment includes a magnetic assembly 150 forming a magnetic field and generating resonance of atomic nuclei, a controller 120 controlling the operation of the magnetic assembly 150, and an image processor 160 receiving an echo signal, i.e., an MR signal, generated from the atomic nuclei and generating an MR image.

The magnetic assembly 150 includes a main magnet 151 forming a static magnetic field in the bore thereof, a gradient coil unit 152 generating gradients in the static magnetic field and thus forming gradient magnetic fields, and a radio frequency (RF) coil unit 153 exciting the atomic nuclei by applying an RF pulse and receiving an echo signal from these atomic nuclei. That is, when a target object is located in the bore of the magnetic assembly 150, the static magnetic field, the gradient magnetic fields and the RF pulse are applied to the object, and thus, atomic nuclei of the object are excited and an echo signal is generated from the atomic nuclei.

The controller 120 includes a static magnetic field controller 121 controlling the intensity and direction of the static magnetic field formed by the main magnet 151, and a pulse sequence controller 122 designing a pulse sequence and controlling the gradient coil unit 152 and the RF coil unit 153 based on the pulse sequence.

The MRI apparatus 100 in accordance with an exemplary embodiment includes a gradient controller 130 applying a gradient signal to the gradient coil unit 152 and an RF transmitter 140 applying an RF signal to the RF coil unit 153, and thus the pulse sequence controller 122 may control the gradient controller 130 and the RF transmitter 140 so as to adjust the magnetic field gradients formed in the bore of the magnetic assembly 150 and the RF applied to the atomic nuclei.

The RF coil unit 153 is connected to the image processor 160, and the image processor 160 includes a data receiver 161 collecting data regarding a spin echo signal, i.e., the magnetic resonance signal, generated from the atomic nuclei, a data storage 162 storing data received by the data receiver 161, and a data processor 163 generating an MR image by processing the data stored in the data storage 162.

The data receiver 161 may include a pre-amplifier amplifying the magnetic resonance signal received by the RF coil unit 153, a phase detector receiving the magnetic resonance signal transmitted from the pre-amplifier and then detecting a phase, and an A/D converter converting an analog signal acquired through phase detection into a digital signal. Further, the data receiver 161 transmits the magnetic resonance signal converted into the digital signal to the data storage 162.

A data space constructing a two-dimensional (2D) Fourier space is formed in the data storage 162, and when storage of overall data, scanning of which has been completed, is completed, the data processor 163 reconfigures the image of the object by performing 2D inverse Fourier transform upon data in the 2D Fourier space. The reconfigured image is displayed on a display 112.

Further, the MRI apparatus 100 in accordance with an exemplary embodiment may include a user operation unit 110, and may thus receive control instructions regarding the overall operation of the MRI apparatus 100 from a user and, specifically, receive instructions regarding a scan sequence from the user and generate a pulse sequence thereby.

The user operation unit 110 may include an operating console 111 provided so as to allow a user to operate a system, and the display 112 displaying a control state and displaying the image generated by the image processor 160 so as to allow the user to diagnose the health state of the object.

Figure 2:
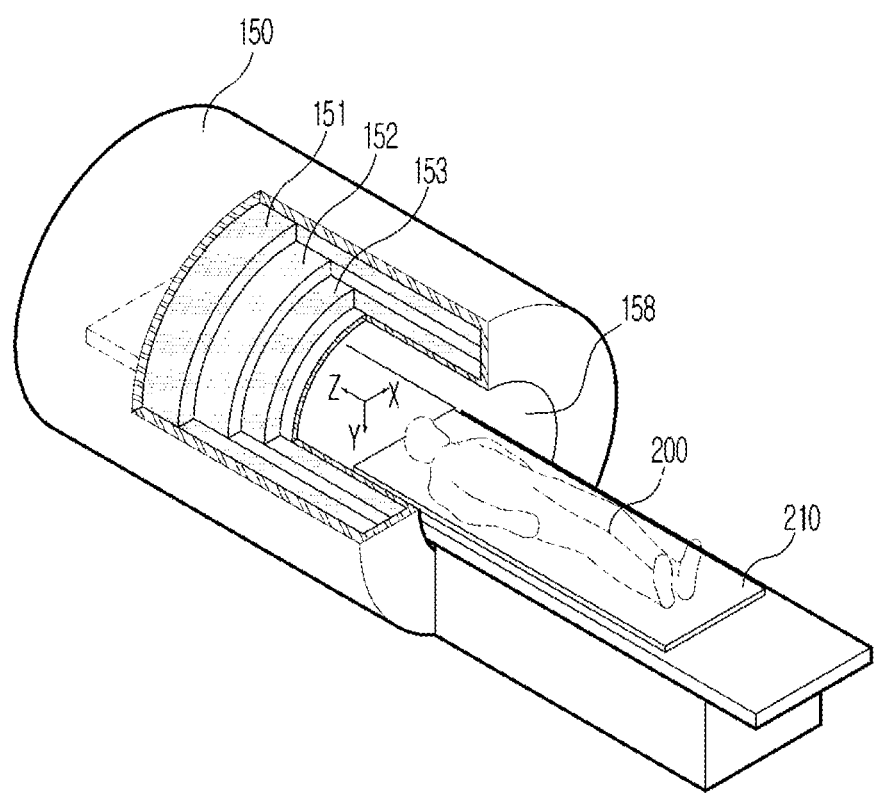
FIG. 2 is a view schematically illustrating the external appearance of the MRI apparatus.
Figure 3:
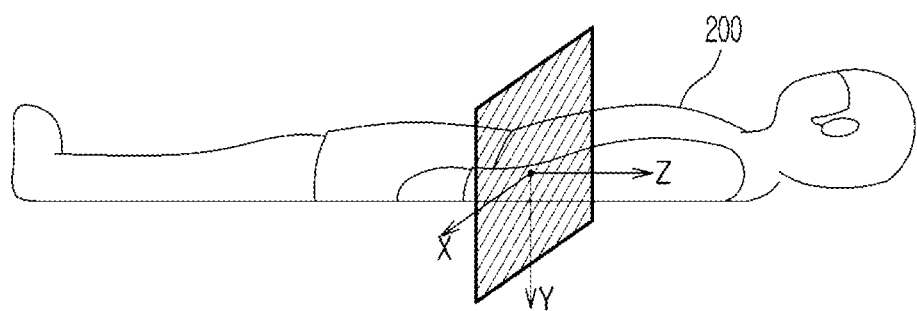
FIG. 3 is a view illustrating an object along the X, Y and Z axes.
Figure 4A:
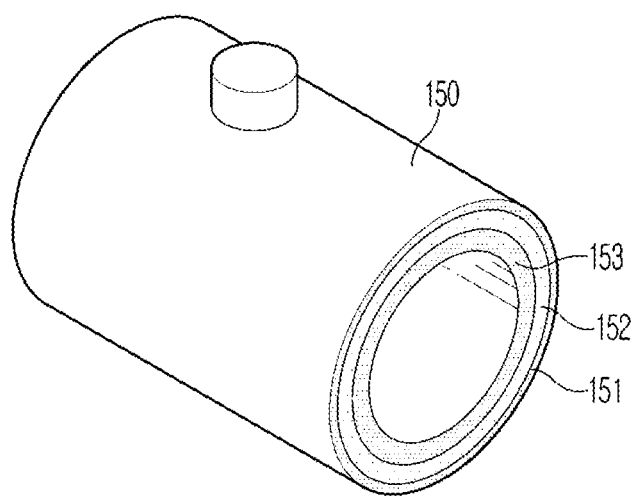
FIGS. 4A and 4B are views illustrating the structure of a magnetic assembly and a gradient coil unit.
Figure 4B:
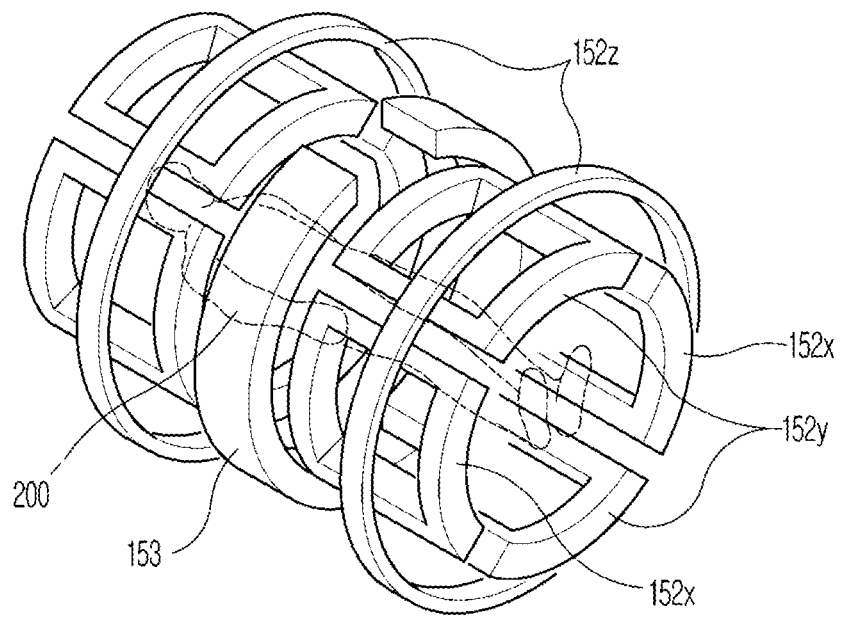

FIG. 2 is an overall view of the MRI apparatus, FIG. 3 is a view showing a cross-section of an examination region, i.e., imaging region, in which an object is placed, along the X, Y and Z axes, and FIGS. 4A and 4B are views illustrating the structure of the magnetic assembly and the structure of the gradient coil unit.

Hereinafter, the detailed operation of an exemplary MRI apparatus 100 will be described.

With reference to FIG. 2, the magnetic assembly 150 has a cylindrical shape, the bore of which is void, and may be referred to as a gantry. The bore of the magnetic assembly 100 is referred to as a cavity or a bore 158, and a transfer unit 210 transfers an object 200 positioned thereon to the bore 158 to acquire an MR image.

The magnetic assembly 150 includes the main magnet 151, the gradient coil unit 152, and the RF coil unit 153.

The main magnet 151 may be formed in a shape in which a coil is wound around the bore 158, and when current is applied to the main magnet 151, a static magnetic field is formed at the inside of the magnetic assembly 150, i.e., in the bore 158.

The direction of the static magnetic field is generally parallel with the driving axis of the magnetic assembly 150.

When the static magnetic field is formed in the bore 158, atomic nuclei of atoms constituting the object 200, specifically, hydrogen atoms, are arranged in the direction of the static magnetic field and execute precession in the direction of the static magnetic field. The precession speed of atomic nuclei may be represented as a precession frequency, and such a precession frequency may be referred to as a Larmor frequency and expressed by Equation 1 below.

$$\omega = \gamma B_0 \qquad \text{[Equation 1]}$$

Here, $\omega$ is a Larmor frequency, $\gamma$ is a proportional constant which varies according to kinds of atomic nuclei, and $B_0$ is the intensity of an external magnetic field measured in tesla (T) or gauss (G).

For example, hydrogen protons have a precession frequency of 42.58 MHz in the external magnetic field of 1 T and, among elements constituting a human body, hydrogen occupies the largest percentage, and thus an MR signal is acquired predominantly using precession of hydrogen protons during MRI.

The gradient coil unit 152 generates gradients in the static magnetic field formed in the bore 158, thus forming gradient magnetic fields.

As shown in FIG. 3, an axis running parallel with the lengthwise direction from the head to the feet of the object 200, i.e., an axis running parallel with the direction of the static magnetic field, may be defined as the Z-axis, an axis running parallel with the lateral direction of the object 200 may be defined as the X-axis, and an axis running parallel with the vertical direction in the space may be defined as the Y-axis.

In order to acquire three dimensional (3D) spatial information of the magnetic resonance signal, gradient magnetic fields in all directions of the X-axis, Y-axis and Z-axis are required. For example, the gradient coil unit 152 includes three pairs of gradient coils.

As shown in FIG. 4B, Z-axis gradient coils 152z include a pair of ring type coils, and Y-axis gradient coils 152y are located above and below the object 200. Further, X-axis gradient coils 152x are located at the left and right sides of the object 200.

Figure 5:
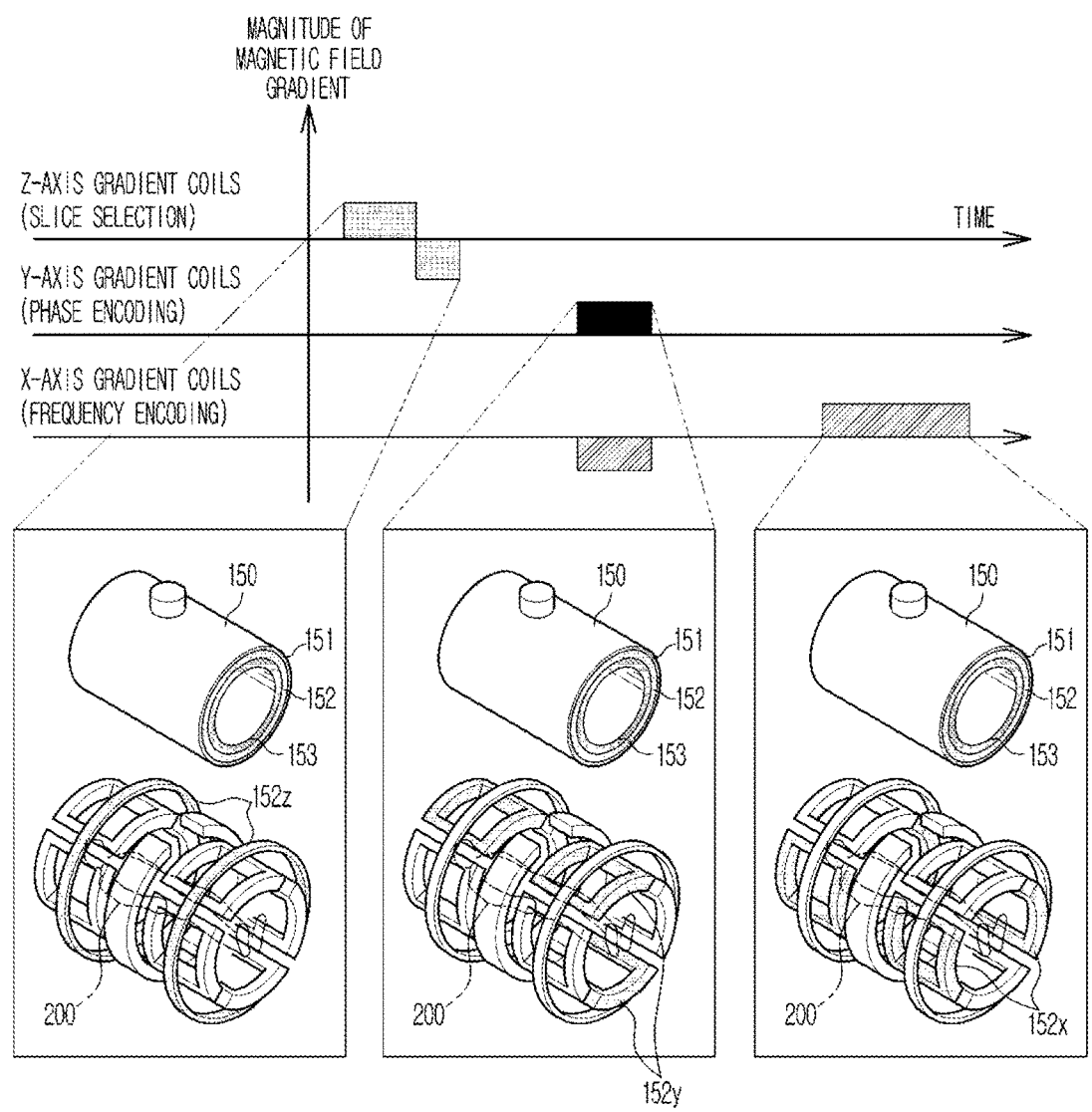
FIG. 5 is a view illustrating a pulse sequence regarding operations of gradient coils.

FIG. 5 is a view illustrating a pulse sequence regarding operations of the respective gradient coils of the gradient coil unit.

When direct currents having opposite polarities flow in the two Z-axis gradient coils 152z in opposite directions, the magnetic field is changed in the Z-axis direction and thus a gradient magnetic field is formed.

When the gradient magnetic field is formed by flow of current along the Z-axis gradient coils 152z for a designated time, the resonance frequency is changed to a higher frequency or a lower frequency according to the magnitude of the magnetic field gradient. Then, when an RF signal corresponding to a specific position is applied through the RF coil unit 153, only protons of a slice corresponding to the specific position resonate. Therefore, the Z-axis gradient coils 152z are used in slice selection. As the magnetic field gradient formed in the Z-axis direction is increased, a slice having a smaller thickness may be selected.

When the slice is selected through the magnetic field gradient formed by the Z-axis gradient coils 152z, all spins constituting the slice have the same frequency and the same phase and thus the respective spins are indistinguishable from one another.

At this time, when a magnetic field gradient in the Y-axis direction is formed by the Y-axis gradient coils 152y, the magnetic field gradient causes phase shift so that rows of the slice have different phases.

That is, when the Y-axis magnetic field gradient is formed, the phase of the spins of the row to which a large magnetic field gradient is applied is changed to a higher frequency, and the phase of the spins of the row to which a small magnetic field gradient is applied is changed to a lower frequency. When the Y-axis magnetic field gradient is removed, phase shift of the respective rows of the selected slice occurs and thus the rows have different phases, and thereby, the rows may be distinguished from one another. As described above, the magnetic field gradient formed by the Y-axis gradient coils 152y is used in phase encoding.

The slice is selected through the magnetic field gradient formed by the Z-axis gradient coils 152z, and the rows constituting the selected slice are distinguished from one another by different phases thereof through the magnetic field gradient formed by the Y-axis gradient coils 152y. However, the respective spins constituting each row have the same frequency and the same phase, and are thus indistinguishable from one another.

At this time, when a magnetic field gradient in the X-axis direction is formed by the X-axis gradient coils 152x, the X-axis magnetic field gradient causes the spins constituting each row to have different frequencies so that the respective spins are distinguishable from one another. As described above, the magnetic field gradient formed by the X-axis gradient coils 152x is used in frequency encoding.

As described above, the magnetic field gradients formed by the Z-axis, Y-axis and X-axis gradient coils execute encoding of spatial positions of the respective spins, i.e., spatial encoding, through slice selection, phase encoding and frequency encoding.

The gradient coil unit 152 is connected to the gradient controller 130, and the gradient controller 130 applies a gradient waveform, i.e., a current pulse, to the gradient coil unit 152 according to a control signal transmitted from the pulse sequence controller 122 and then generates magnetic field gradients. Therefore, the gradient controller 130 may be referred to as a gradient power supply, and may include three drive circuits corresponding to the three pairs of gradient coils 152x, 152y and 152z of the gradient coil unit 152. The detailed configuration of the operation of the gradient controller 130 will be described later, and an electrical signal, such as a current or voltage pulse applied to the gradient controller 130 to form magnetic field gradients, may be referred to as a gradient waveform.

As described above, atomic nuclei arranged by the external magnetic field execute precession at the Larmor frequency, and the magnetization vector sum of several atomic nuclei may be represented as net magnetization M.

Measurement of a Z-axis component of the net magnetization M is impossible, and thus only $M_{xy}$ may be detected. Therefore, in order to acquire an MR signal, the net magnetization should be present on the X-Y plane through excitation of the atomic nuclei. In order to excite the atomic nuclei, an RF pulse tuned to the Larmor frequency of the atomic nuclei should be applied to the static magnetic field.

The RF coil unit 153 includes a transmission coil transmitting the RF pulse, and a reception coil receiving electromagnetic waves emitted from the excited atomic nuclei, i.e., an MR signal. Otherwise, the RF coil unit 153 may use a coil executing both transmission and reception, such as a head coil, instead of the transmission coil and the reception coil.

The RF coil unit 153 is connected to the RF transmitter 140, and the RF transmitter 140 applies an RF signal to the RF coil unit 153 according to a control signal transmitted from the pulse sequence controller 122 so that the RF coil unit 153 may transmit the RF pulse to the bore of the magnetic assembly 150.

The RF transmitter 140 may include a modulation circuit modulating an RF signal into a pulse type signal, and an RF power amplifier amplifying the pulse type signal.

As a method to acquire an MR signal from atomic nuclei, a spin echo pulse sequence is may be used. If the RF coil unit 153 applies RF pulses, when an RF pulse is transmitted one more time at a proper time interval Δt after application of the first RF pulse, strong transverse magnetization of the atomic nuclei occurs after a time Δt therefrom has elapsed, and an MR signal may be acquired therefrom. This is referred to as a spin echo pulse sequence, and time taken to generate the magnetic resonance signal after application of the first RF pulse is referred to as time echo (TE).

A flip degree of protons may be represented as an angle to which the protons move from the axis where the protons are located before flip, and be represented as a 90 degree RF pulse, a 180 degree RF pulse, etc. according to the flip degree of the protons.

When current of a strong pulse is applied to the gradient coil unit 152, eddy current flows in the main magnet 151 surrounding the gradient coil unit 152 in a direction suppressing generation of magnetic field gradients.

Figure 6:
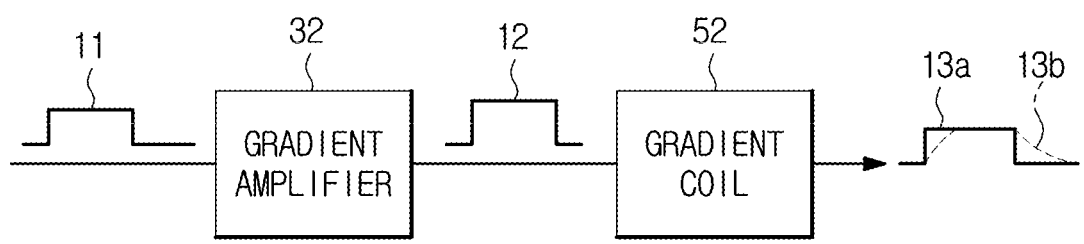
FIG. 6 is a view illustrating generation of eddy current.

FIG. 6 is a view illustrating generation of eddy current.

With reference to FIG. 6, according to a related art MRI device, a current pulse 11 or 12 generated under pulse sequence control is amplified by a gradient amplifier 32 and is applied to a gradient coil 52. However, when eddy current is estimated, a static magnetic field is changed in the opposite direction to the desired direction of a magnetic field gradient. Therefore, as shown in FIG. 6, a magnetic field gradient 13b formed in the bore of the magnetic assembly 150 is distorted differently from an intended magnetic field gradient 13a.

If eddy current is generated in the magnetic field gradient for slice selection, a slice profile becomes poor, thus causing a poor signal-to-noise ratio of an image.

If eddy current is generated in the magnetic field gradient for frequency encoding, non-uniform sampling in a k space occurs in the direction of frequency encoding and, thus, resolution of an image is lowered and ringing and blur at a boundary region occurs. Influence of eddy current varies according to image methods and is increased in case of a magnetic field gradient echo image and a high-speed image.

Therefore, the MRI apparatus 100 in accordance with an exemplary embodiment includes an eddy current compensator 132 to compensate for distortion of magnetic field gradients due to eddy current. Hereinafter, operation regarding compensation of distortion of magnetic field gradients will be described in detail.

Figure 7:
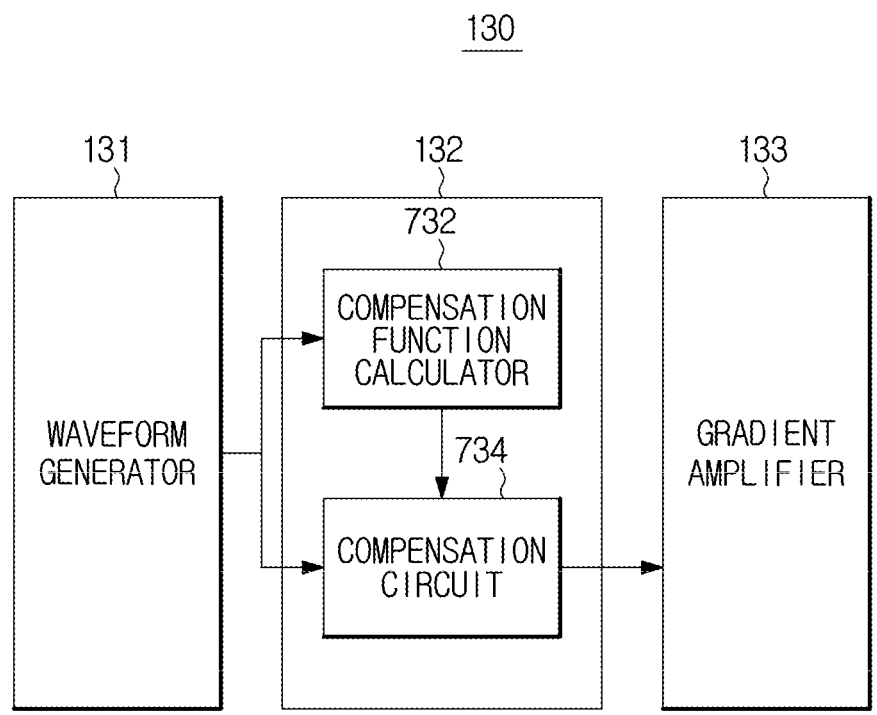
FIG. 7 is a control block diagram of a gradient controller in accordance with an exemplary embodiment.

FIG. 7 is a control block diagram illustrating the configuration of the gradient controller in the MRI apparatus in accordance with an exemplary embodiment.

With reference to FIG. 7, the gradient controller 130 includes a waveform generator 131, an eddy current compensator 132, and a gradient amplifier 133. As described above, when a current pulse is applied to the gradient coil unit 152, eddy current is estimated and distorts magnetic field gradients. Therefore, the gradient controller 130 includes the eddy current compensator 132 executing pre-emphasis of the current pulse as much as the amount of the magnetic field gradients distorted by eddy current, and may thus compensate for distortion of the magnetic field gradients formed within the magnetic assembly 150.

Specifically, the waveform generator 131 generates a gradient waveform according to the pulse sequence designed by the pulse sequence controller 122. Here, the gradient waveform may be a current pulse. The generated gradient waveform is input to the eddy current compensator 132 before input to the gradient amplifier 133, and the eddy current compensator 132 compensates for influence of eddy current in advance.

The eddy current compensator 132 includes a compensation function calculator 732 calculating a compensation function and a compensation circuit 734 compensating for influence of eddy current in advance using the calculated compensation function. The system characteristics of the gradient coil unit 152 or the magnetic assembly 150 including the gradient coil unit 152 are reflected in the compensation function. On the assumption that system characteristics are defined as a function H(s), the compensation circuit 734 cancels out distortion, which will be generated due to the system characteristics of the gradient coil unit 152 or the magnetic assembly 150 including the gradient coil unit 152, in advance by applying an inverse function $H^{-1}(s)$ to the gradient waveform. Here, it is assumed that the system is a linear time invariant system, and H(s) may be a transfer function.

Therefore, the compensation function calculated by the compensation function calculator 732 becomes $H^{-1}(s)$, and the compensation circuit 734 applies $H^{-1}(s)$ to the gradient waveform so that distortion of magnetic field gradients formed in the bore of the magnetic assembly 150 may be compensated for by executing pre-emphasis of a portion which will be distorted. The pre-emphasized gradient waveform is applied to the gradient coil unit 152 through the gradient amplifier 133.

As described above, since the gradient coil unit 152 includes the X-axis coils 152x, the Y-axis coils 152y, and the Z-axis coils 152z and the gradient controller 130 respectively applies current pulses to the X-axis coils 152x, the Y-axis coils 152y, and the Z-axis coils 152z, an X-axis gradient waveform applied to the X-axis coils 152x, a Y-axis gradient waveform applied to the Y-axis coils 152y, and a Z-axis gradient waveform applied to the Z-axis coils 152z may be respectively compensated for. Hereinafter, this will be described with reference to FIG. 8.

Figure 8:
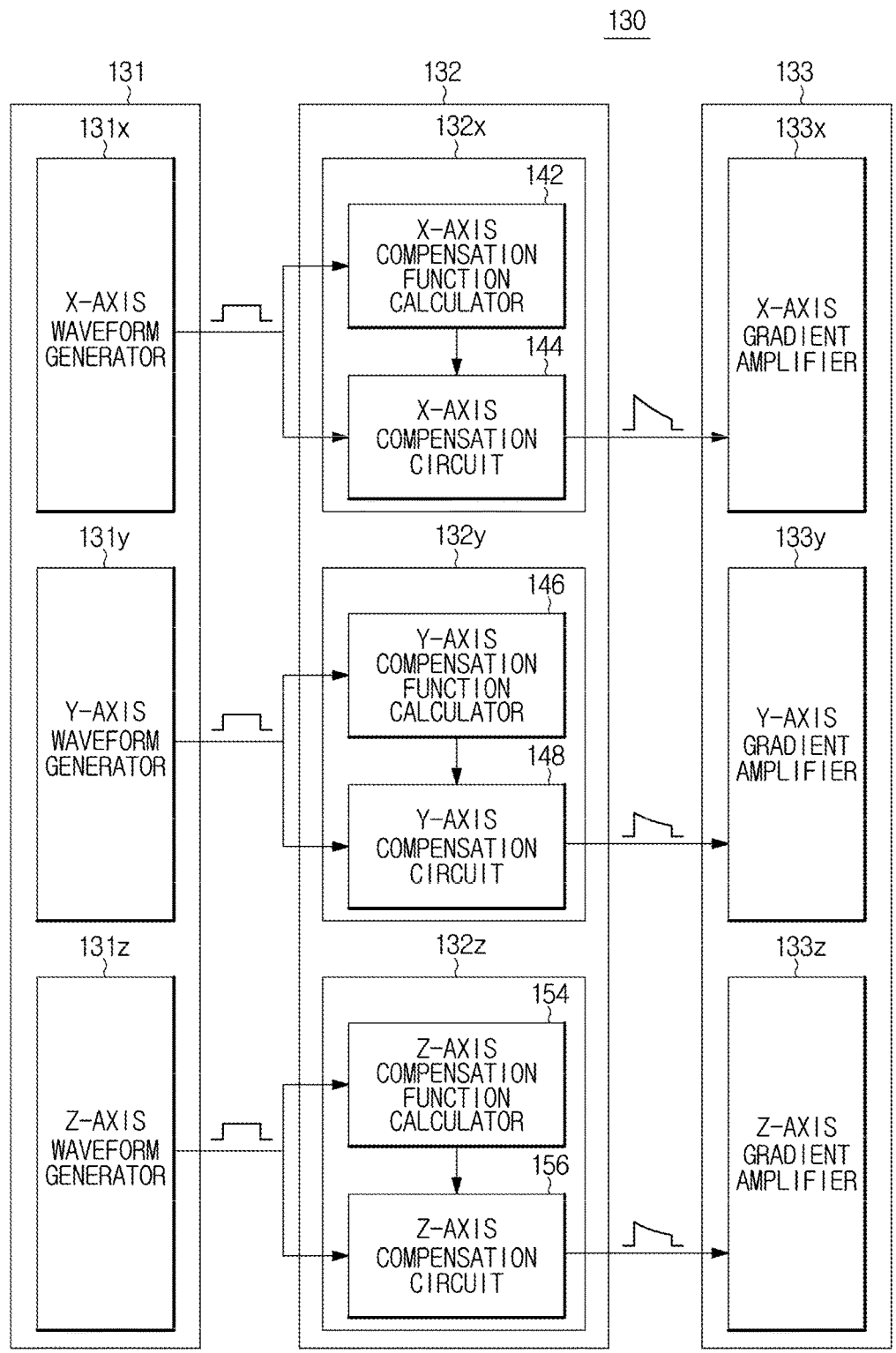
FIG. 8 is a control block diagram illustrating in detail the gradient controller shown in FIG. 7.

FIG. 8 is a control block diagram illustrating segmentation of the gradient controller shown in FIG. 7 including components corresponding to the X-axis coils, the Y-axis coils, and the X-axis coils.

As shown in FIG. 8, the waveform generator 131 includes an X-axis waveform generator 131x, a Y-axis waveform generator 131y, and a Z-axis waveform generator 131z, and thus respectively generates an X-axis waveform to form a magnetic field gradient in the X-axis direction, a Y-axis waveform to form a magnetic field gradient in the Y-axis direction, and a Z-axis waveform to form a magnetic field gradient in the Z-axis direction. The generated waveform may be of a pulse type.

The eddy current compensator 132 includes an X-axis compensator 132x, a Y-axis compensator 132y, and a Z-axis compensator 132z, and thus respectively compensates the X-axis waveform, the Y-axis waveform, and the Z-axis waveform.

The X-axis compensator 132x includes an X-axis compensation function calculator 142 and an X-axis compensation circuit 144, the Y-axis compensator 132y includes a Y-axis compensation function calculator 146 and a Y-axis compensation circuit 148, and the Z-axis compensator 132z includes a Z-axis compensation function calculator 154 and a Z-axis compensation circuit 156.

However, since an operation to compensate for distortion generated due to eddy current does not vary according to axes of the magnetic field gradients, hereinafter, such an operation will be described based on the components of FIG. 7 for convenience of description.

Distortion of measured magnetic field gradient may be caused by system characteristics of the gradient coil unit 152 and the magnetic assembly 150 including the gradient coil unit 152, and the system characteristics may be represented by the system characteristic function H(s), as described above.

Figure 11:
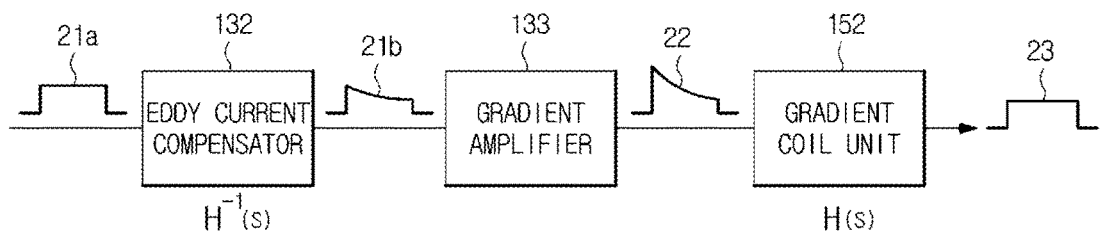
FIG. 11 is a view schematically illustrating compensation of distortion due to eddy current by the MRI apparatus in accordance with an exemplary embodiment.

Therefore, in order to compensate for distortion after passing through the gradient coil unit 152 in advance, the compensation circuit 734 of the eddy current compensator 132, applies the system characteristic inverse function $H^{-1}(s)$ to an input waveform 21a, as shown in FIG. 11. That is, the system characteristic inverse function $H^{-1}(s)$ becomes a compensation function calculated and applied by the compensation circuit 734 of the eddy current compensator 132.

Hereinafter, calculation of the compensation function by the compensation function calculator 732 will be described in detail.

FIGS. 9A, 9B, 9C, and 9D are views schematically illustrating application of an ideal test gradient waveform and measurement of magnetic fields.

In order to calculate the compensation function, a phantom which is designed in advance is located in the bore of the magnetic assembly 150, a test gradient waveform is applied, and magnetic field gradients are measured at plural TEs.

Figures 9A, 9B:
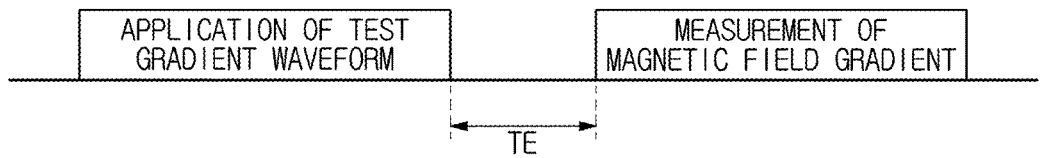
FIGS. 9A, 9B, 9C, and 9D are views schematically illustrating application of an ideal test gradient waveform and measurement of magnetic fields.

Since the measured magnetic field gradients may include components caused by other factors than the applied test gradient waveform, magnetic field gradients are measured under the condition that the test gradient waveform is applied, as shown in FIG. 9B, and the test gradient waveform is not applied, as shown in FIG. 9A.

Otherwise, magnetic field gradients may be measured by respectively applying test gradient waveforms having opposite phases, as shown in FIG. 9B. The test gradient waveform application methods shown in FIGS. 9A and 9B are just examples applied to an exemplary embodiment, and an exemplary embodiment is not limited thereto.

Since the magnetic field gradients are linearly formed in proportion to distance in an arbitrary direction in the bore of the magnetic assembly 150, the frequency of an MR signal received by the RF coil unit 153 increases or decreases in proportion to the magnetic field gradients. The magnetic field gradients may be measured in various methods based on the above description. That is, a separate device to measure magnetic field gradients may be used, or the magnetic field gradients may be calculated using a signal transmitted from the data receiver 161, shown in FIG. 1. An exemplary embodiment is not limited in terms of the gradient magnetic measurement methods.

Figures 10A, 10B:
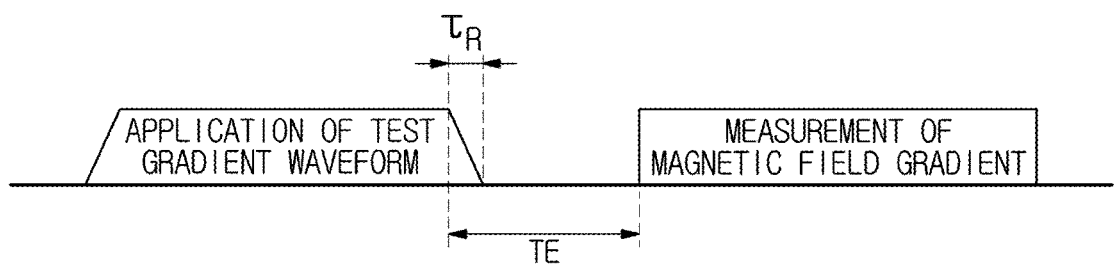
FIGS. 10A and 10B are views schematically illustrating measurement of magnetic field gradients when the test gradient waveform is not applied and when the test gradient waveform is applied.

FIGS. 10A and 10B are views schematically illustrating measurement of magnetic field gradients when the test gradient waveform is not applied and when an actual test gradient waveform is applied.

Figure 9C:
Figure 9D:
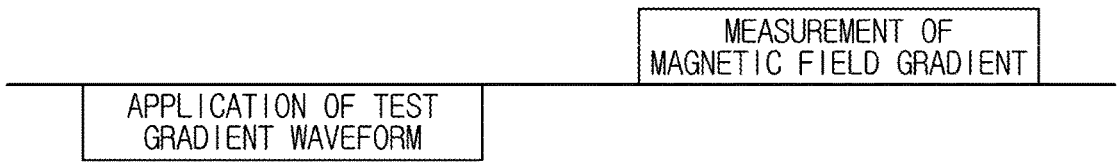

Although FIGS. 9B, 9C, and 9D illustrate the applied test gradient waveform as having the shape of a step function, such a test gradient waveform is just the ideal gradient waveform, and actually, application of the ideal step function-shaped test gradient waveform may be difficult due to physical limitations. As an example of an actually applied test gradient waveform, there is a linear ramp function defined as a finite ramp time $\tau_R$.

In the related art, a compensation function is calculated on the assumption that the applied test gradient waveform has the shape of the ideal step function. However, since the ideal step function-shaped test gradient waveform differs from an actually applied test gradient waveform, accuracy of the compensation function is lowered and an additional test to compensate for the compensation function should be repeated. Therefore, the MRI apparatus 100 in accordance with an exemplary embodiment calculates a compensation function in which the shape of the actually applied test gradient waveform is reflected to more accurately compensate for distortion of magnetic field gradients without the repeated test.

The compensation function calculator 732 calculates a compensation function based on the relations among the measured magnetic field gradient, the applied test gradient waveform and the system characteristics as stated in Equation 2 below.

$$O(s)=H(s) \cdot I(s) \rightarrow H(s)=O(s)/I(s) \qquad \text{[Equation 2]}$$

Here, O(s) represents the measured magnetic field gradient, H(s) represents the system characteristic function, and I(s) represents the applied test gradient waveform, i.e., a current or voltage pulse. That is, when a gradient waveform expressed by I(s) is input, a magnetic field gradient O(s) is measured as the system characteristic function H(s). Since the compensation function corresponds to a system characteristic inverse function, as described above, the compensation function calculator 732 estimates a system characteristic function H(s) based on Equation 2 above.

Here, a function representing an actual test gradient waveform other than the ideal step function 1/s is substituted for I(s) representing the applied test gradient waveform. For example, if the actually applied test gradient waveform has the shape of a linear ramp function defined as a finite ramp time $\tau_R$, as shown in FIG. 10B, I(s) may be defined as Equation 3 below. In Equation 3, τ represents ramp time.

$$I(s)=(1-e^{-\tau s})/\tau s^2 \qquad \text{[Equation 3]}$$

The ramp function is just one example of the actual gradient waveform, and the actual gradient waveform may have other shapes, such as a sine function, in addition to the ramp function. Further, if the actual gradient waveform corresponds to the ramp function, the shape of the ramp function may vary according to polarity, amplitude or ramp time.

In order to more accurately calculate the compensation function, the actually applied test gradient waveform may be measured. For this purpose, the input terminal of the gradient amplifier 133 may read a signal, and then, such a result may serve as the actually applied test gradient waveform. Otherwise, the output terminal of the gradient amplifier 133 may read a signal.

The compensation function calculator 732 may estimate the system characteristic function H(s) by measuring the actually applied gradient waveform or assuming that the actually applied gradient waveform is a proper-shaped function.

Then, the compensation function calculator 732 calculates the compensation function $H^{-1}(s)$ from the estimated system characteristic function H(s).

Hereinafter, another example of calculation of a compensation function if the actually applied test gradient waveform has the shape of a linear ramp function, as shown in FIG. 10, will be described.

The actually applied test gradient waveform mainly has the shape of a linear ramp function. When ramp time of the ramp function is close to 0, the ramp function has a similar shape to a step function. Therefore, the compensation function calculator 732 may estimate a system characteristic function H(s)' by assuming that the actually applied gradient waveform has the shape of a step function, and estimate a corrected system characteristic function H(s) by correcting coefficients of the system characteristic function H(s)' so as to match the shape of the actually applied test gradient waveform.

In more detail, coefficients $C_k'$ and $\omega_k$ of the system characteristic function H(s)' may be calculated from the system characteristic function H(s)', acquired by assuming that the actually applied gradient waveform has the shape of a step function, and the measured magnetic field gradient (here, k is a fixed number greater than 1). $C_k'$ represents a proportional constant, and $\omega_k$ represents a time constant. Since gradient magnet fields are calculated at plural TEs, plural sets of the respective constants are calculated.

The constants calculated by assuming that the actually applied gradient waveform has the shape of a step function are corrected using ramp time of the actually applied gradient waveform and a correction equation. Here, the correction equation may be expressed by Equation 4 below.

$$C_k=\omega_k \tau_R/\{\exp(\omega_k \tau_R-1)\}C_k' \qquad \text{[Equation 4]}$$

Although the above example illustrates the time constant as maintaining the same value before and after correction, the time constant may be corrected as needed.

The system characteristic function H(s) in which the actually applied gradient waveform is reflected may be estimated by correcting the constants, and the finally calculated compensation function becomes $H^{-1}(s)$.

However, the description of using Equation 3 and Equation 4 above is just one example of operation of the compensation function calculator 732, and calculation of the compensation function is not always carried out according to Equation 3 and Equation 4 above. Calculation of the compensation function may vary according to the actually applied test gradient waveform, and although the actually applied test gradient waveform has the shape of a ramp function, the ramp function may be directly applied without use of the above-described system characteristic function acquired from the step function-shaped test gradient waveform.

The compensation function calculated by the compensation function calculator 732 is set within the compensation circuit 734, and the compensation circuit 734 compensates for distortion which will be generated in the magnetic field gradient in advance through pre-emphasis, i.e., pre-amplification, of a gradient waveform which will be applied. The shape of the actually applied test gradient waveform is reflected in such a compensation function, and thus, compensation having improved accuracy may be executed without correction of coefficients through repeated measurement.

In order to calculate a compensation function in which system characteristics are accurately reflected, a magnetic field gradient may be measured while varying the shape of the test gradient waveform, and the compensation function may be calculated using the measured magnetic field gradient. Here, the varying shape of the gradient waveform may be at least one selected from the group consisting of polarity, amplitude and ramp time.

Calculation of the compensation function may be executed before the MRI apparatus 100 is used, be executed periodically, or be executed frequently. That is, in accordance with an exemplary embodiment, the frequency and time of calculation of the compensation function are not limited.

FIG. 11 is a view schematically illustrating compensation of distortion due to eddy current by the MRI apparatus in accordance with an exemplary embodiment.

With reference to FIG. 11, an original gradient waveform 21a generated by the waveform generator 131 is input to the eddy current compensator 132 before input to the gradient amplifier 133. The original gradient waveform 21a is designed by the pulse sequence controller 122 to acquire an MR signal of an object.

In the eddy current compensator 132, a compensation function calculated by the compensation function calculator 732 is set, as described above. When the original gradient waveform 21a is input to the compensation circuit 734, the compensation circuit 734 outputs an emphasized gradient waveform 21b acquired by executing pre-emphasis of a portion which will be distorted by applying the compensation function. Therefore, the compensation circuit 734 may serve as a compensation filter.

The emphasized gradient waveform 21b is input to the gradient amplifier 133, is amplified to form an amplified gradient waveform 22 generating a magnetic field gradient, and is then output. The amplified gradient waveform 22 is input to the gradient coil unit 152, and forms a magnetic field gradient 23 in which distortion is compensated.

Since the above-described compensation of distortion of the magnetic field gradient is respectively carried out by each of the X-axis gradient coils 152x, the Y-axis gradient coils 152y, and the Z-axis gradient coils 152z, the X-axis eddy current compensator 132x, the Y-axis eddy current compensator 132y, and the Z-axis eddy current compensator 132z compensate for distortion of magnetic field gradients by respectively executing pre-emphasis of an X-axis gradient waveform, a Y-axis gradient waveform, and a Z-axis gradient waveform.

Hereinafter, a control method of an MRI apparatus in accordance with an exemplary embodiment will be described.

Figure 12:
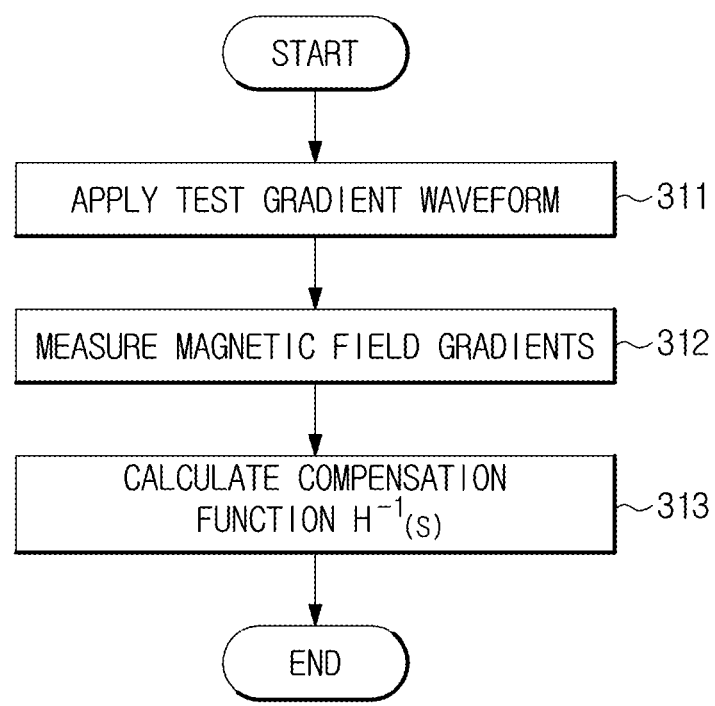
FIG. 12 is a flowchart illustrating a process of calculating a compensation function an MRI apparatus in accordance with an exemplary embodiment.

FIG. 12 is a flowchart illustrating a process of calculating a compensation function in the control method of the MRI apparatus in accordance with an exemplary embodiment.

In order to calculate a compensation function, test-measured values of magnetic field gradients are acquired. Therefore, a phantom, which is designed in advance to execute a test, is located in the bore of the magnetic assembly 150.

With reference to FIG. 12, a test gradient waveform is first applied (Operation 311). The test gradient waveform may be designed by the pulse sequence controller 122 to calculate the compensation function.

Thereafter, magnetic field gradients formed in the bore of the magnetic assembly 150 are measured (Operation 312). Here, magnetic field gradients may be measured at plural TEs. In order to exclude influence of other factors than the test gradient waveform, magnetic field gradients may be respectively measured before and after application of the test gradient waveform. Otherwise, magnetic field gradients may be measured while varying the phase of the test gradient waveform.

Based on results of measurement, a compensation function $H^{-1}(s)$ in which the actual shape of the applied test gradient waveform is reflected is calculated (Operation 313). In more detail, according to Equation 2 above, the system characteristic function H(s) of the gradient coil unit 152 or the magnetic assembly 150 including the gradient coil unit 152 may be estimated using the measured magnetic field gradient and the actually applied test gradient waveform. For example, if the actually applied test gradient waveform is a ramp function having a finite ramp time, the system characteristic function H(s) may be estimated using the ramp function corresponding to the actually applied test gradient waveform and the measure gradient magnet field. However, the ramp function is just one example of the actual gradient waveform, and the actual gradient waveform may have other shapes, such as a sine function, in addition to the ramp function.

In order to more accurately estimate the system characteristic function, the actually applied test gradient waveform may be measured and a result of measurement may be used as the actually applied test gradient waveform. The actually applied test gradient waveform may be measured by reading a signal through the input terminal of the gradient amplifier 133.

When the system characteristic function H(s) is estimated, the system characteristic inverse function $H^{-1}(s)$ is calculated as the compensation function.

In order to compensate for distortion of each of X-axis, Y-axis, and Z-axis magnetic field gradients, measurement of a magnetic field gradient and calculation of a compensation function may be executed in regard to each of the X-axis, the Y-axis, and the Z-axis.

Further, in order to calculate a compensation function in which system characteristics are accurately reflected, magnetic field gradients are measured while varying the shape of the test gradient waveform, and the compensation function may be calculated using the measured magnetic field gradients. Here, the varying shape of the gradient waveform may be at least one selected from the group consisting of polarity, amplitude, and ramp time, or test gradient waveforms having different shapes may be generated by the waveform generator 131.

Figure 13:
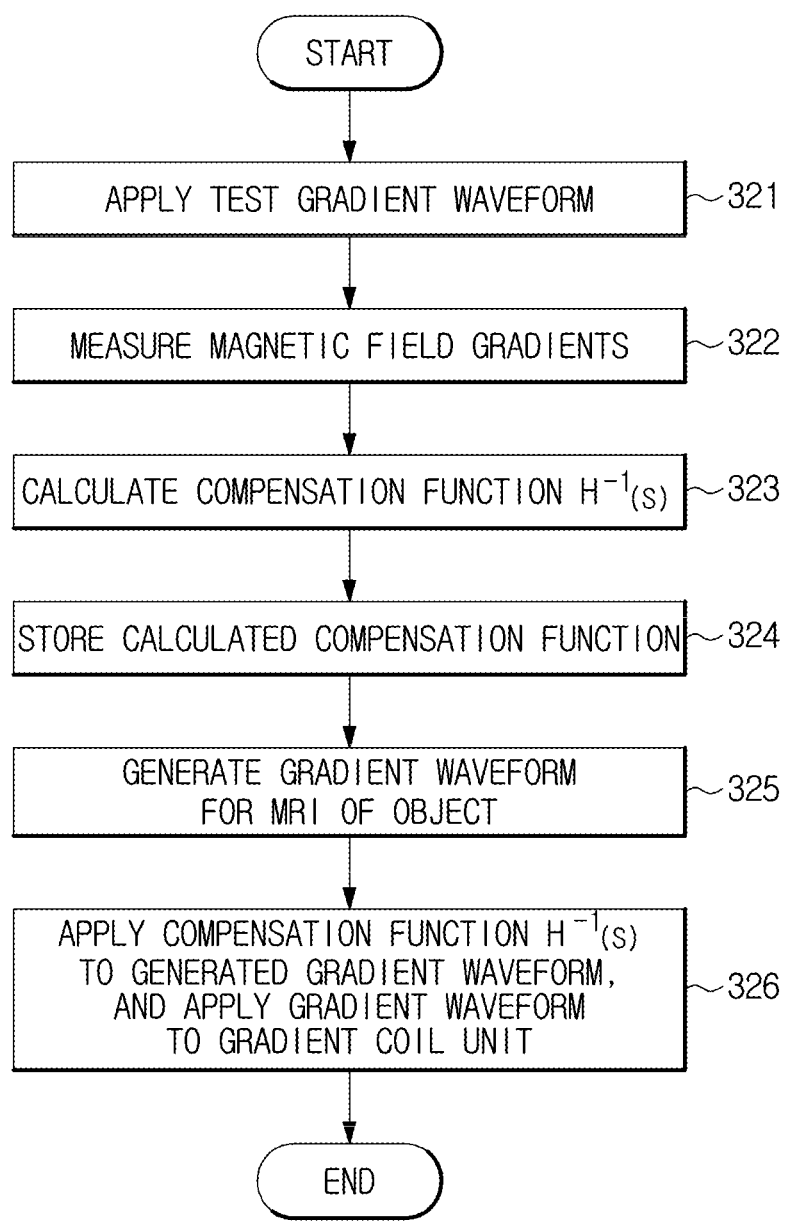
FIG. 13 is a flowchart illustrating a process of compensating for distortion of a gradient magnetic field the MRI apparatus in accordance with an exemplary embodiment.

FIG. 13 is a flowchart illustrating a process of compensating for distortion of a magnetic field gradient in the control method of the MRI apparatus in accordance with an exemplary embodiment.

With reference to FIG. 13, calculation of a compensation function (Operations 321 to 323) is the same as that of FIG. 12. The calculated compensation function is set in the compensation circuit 734 (Operation 324).

Thereafter, a gradient waveform for magnetic resonance imaging of an object is generated (Operation 325), the compensation function $H^{-1}(s)$ is applied to the generated gradient waveform, and then, the gradient waveform is applied to the gradient coil unit 152 (Operation 326). When the compensation function $H^{-1}(s)$ is applied to the gradient waveform, a portion of the gradient waveform which will be distorted is pre-emphasized, and thus, distortion may be compensated for in advance. Therefore, when the gradient waveform to which the compensation function $H^{-1}(s)$ is applied is input to the gradient coil unit 152, a magnetic field gradient having an originally intended waveform may be formed in the bore of the magnetic assembly 150.

Figure 14:
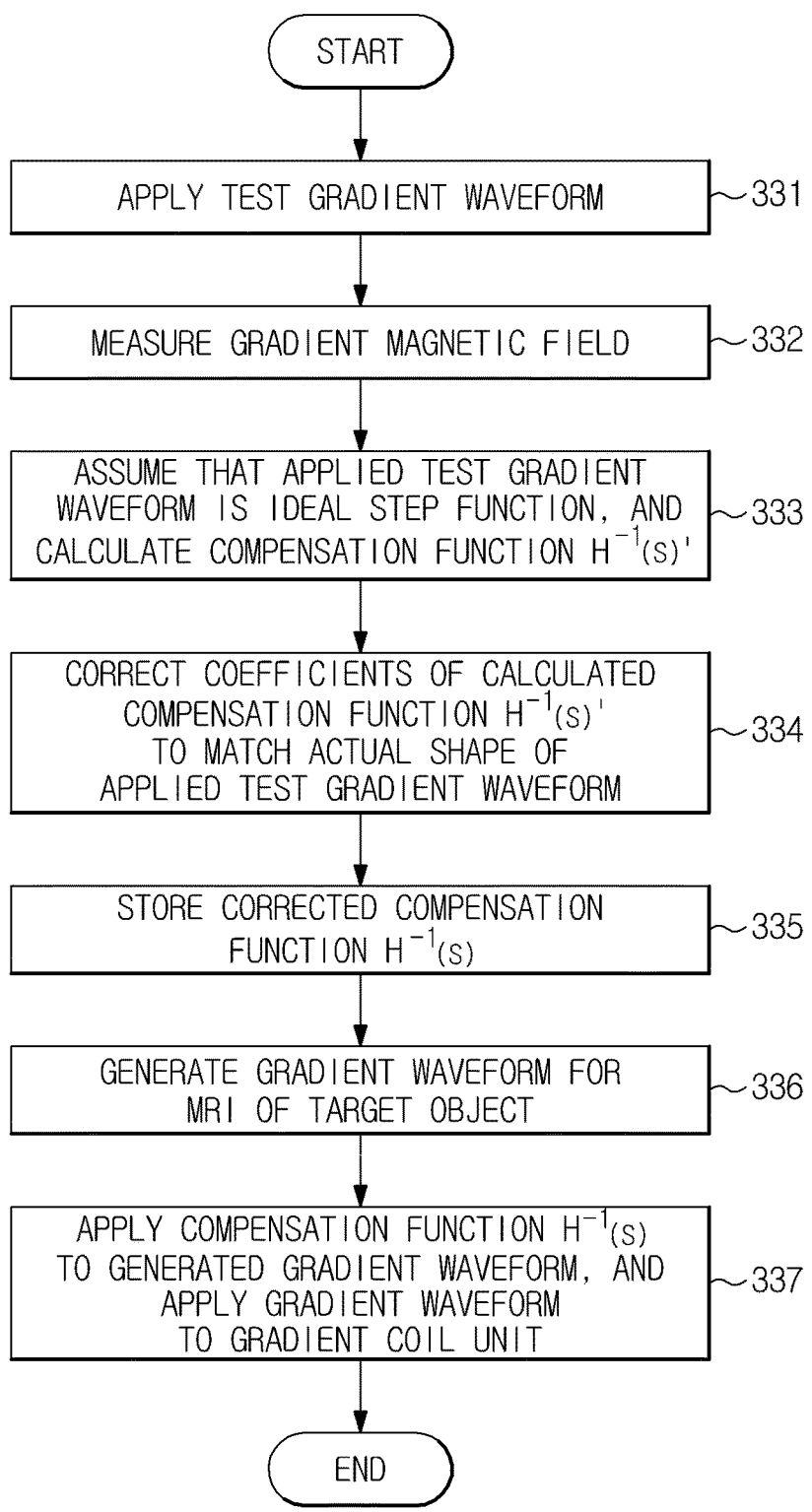
FIG. 14 is a flowchart illustrating one example of calculation of a compensation function the MRI apparatus in accordance with an exemplary embodiment.

FIG. 14 is a flowchart illustrating one example of calculation of a compensation function in the control method of the MRI apparatus in accordance with an exemplary embodiment.

As described above, it is assumed that a test gradient waveform for calculation of a compensation function is a step function. However, application of the test gradient waveform of the shape of the ideal step function is difficult and a ramp function is actually applied as the test gradient waveform. In the control method of the MRI apparatus in accordance with an exemplary embodiment, in order to accurately calculate a compensation function, the shape of an actually applied test gradient waveform is reflected. However, based on the characteristics in that, when ramp time of the ramp function is close to 0, the ramp function has a similar shape to the step function, the acquired compensation function of the step function, i.e., a compensation function acquired by assuming that the applied test gradient waveform is the step function, may be used.

With reference to FIG. 14, a test gradient waveform is first applied (Operation 331), and a magnetic field gradient formed in the bore of the magnetic assembly 150 is measured (Operation 332).

It is assumed that the applied test gradient waveform is the ideal step function, and a compensation function $H^{-1}(s)'$ is calculated based on results of measurement of the magnetic field gradient (Operation 333). Specifically, the compensation function $H^{-1}(s)'$ may be calculated by calculating coefficients of a system characteristic function $H(s)'$, acquired by assuming that the applied test gradient waveform is the step function, by applying the measured magnetic field gradient to the system characteristic function $H(s)'$.

Thereafter, coefficients of the calculated compensation function $H^{-1}(s)'$ are corrected so as to match the actual shape of the applied test gradient waveform (Operation 334). For this purpose, a correction equation expressed by Equation 4 above may be applied. For example, a proportional constant or a time constant of the compensation function $H^{-1}(s)'$ may be corrected.

When the coefficients of the calculated compensation function $H^{-1}(s)'$ are corrected so as to match the actual shape of the applied test gradient waveform, the compensation function $H^{-1}(s)'$ is corrected to a compensation function $H^{-1}(s)$ in which the actual shape of the test gradient waveform is reflected. The corrected compensation function $H^{-1}(s)$ is set in the compensation circuit (Operation 335).

Thereafter, a gradient waveform for magnetic resonance imaging of an object is generated (Operation 336), the compensation function $H^{-1}(s)$ is applied to the generated gradient waveform, and then, the gradient waveform is applied to the gradient coil unit 152 (Operation 337). When the compensation function $H^{-1}(s)$ is applied to the gradient waveform, a portion of the gradient waveform which will be distorted is pre-emphasized, and thus, distortion may be compensated for in advance. Therefore, when the gradient waveform to which the compensation function $H^{-1}(s)$ is applied is input to the gradient coil unit 152, a magnetic field gradient having an originally intended waveform may be formed in the bore of the magnetic assembly 150.

As is apparent from the above description, in an MRI apparatus and a control method thereof in accordance with an exemplary embodiment, the shape of an actually applied gradient waveform is reflected when distortion of a magnetic field gradient is compensated for, thus improving accuracy of compensation.

Although a few exemplary embodiments have been shown and described, exemplary embodiments are not limited thereto. It would be appreciated by those skilled in the art that changes may be made in these exemplary embodiments without departing from the principles and spirit of the disclosure, the scope of which is defined in the claims and their equivalents.

What is claimed is:

1. A control method for a magnetic resonance imaging (MRI) apparatus, the control method comprising:
applying a test gradient waveform to a magnetic assembly, by a gradient controller;
measuring values of magnetic field gradients that are acquired by applying the test gradient waveform, by the gradient controller;
calculating a compensation function to compensate for a distortion of the magnetic field gradients, caused by eddy currents, by accounting for an actual shape of the applied test gradient waveform, using the measured values of the magnetic field gradients and the actual shape of the applied test gradient waveform, by the gradient controller; and
compensating for the distortion of the magnetic field gradients, caused by eddy currents, by executing pre-emphasis of a gradient waveform that is applied to a gradient coil unit, using the calculated compensation function, by the gradient controller.

2. The control method according to claim 1, wherein the calculating the compensation function further includes:
estimating a system characteristic function of the magnetic assembly from the measured values of the magnetic field gradients and from the actual shape of the applied test gradient waveform.

3. The control method according to claim 2, wherein the calculating the compensation function further includes calculating the compensation function from the estimated system characteristic function.

4. The control method according to claim 1, wherein the measured values of the magnetic field gradients are measured at different time echos (TE).

5. The control method according to claim 1, wherein:
the applying the test gradient waveform includes applying the test gradient waveform a plurality of times while varying a shape of the test gradient waveform; and
the calculating the compensation function includes calculating the compensation function using the measured values of the magnetic field gradients according to a shape of the test gradient waveform.

6. The control method according to claim 5, wherein the shape of the test gradient waveform is varied based on at least one or more of a polarity, an amplitude, and a ramp time.

7. The control method according to claim 1, wherein the applying the test gradient waveform includes applying the test gradient waveform while varying a polarity of the test gradient waveform.

8. The control method according to claim 2, wherein the calculating the compensation function includes estimating the system characteristic function using the measured values of the magnetic field gradients when the test gradient waveform is not applied and when the test gradient waveform is applied.

9. The control method according to claim 3, wherein the calculating the compensation function further includes:
calculating an inverse function of the estimated system characteristic function as the compensation function.

10. The control method according to claim 3, wherein the compensation function is calculated by assuming that the actual shape of the applied test waveform is a ramp function having a finite ramp time.

11. A magnetic resonance imaging (MRI) apparatus comprising:
a magnetic assembly including:
a main magnet which includes a bore and forms a static magnetic field in the bore, and
a gradient coil unit which is disposed around the bore and forms magnetic field gradients; and
a gradient controller configured to apply a test gradient waveform to the magnetic assembly, and compensate for a distortion of the magnetic field gradients, caused by eddy currents, by accounting for an actual shape of the applied test gradient waveform,
wherein the gradient controller is further configured to calculate a compensation function to compensate for the distortion of the magnetic field gradients by determining the actual shape of the applied test gradient waveform, and execute pre-amplification of a gradient waveform that is applied to the gradient coil unit, using the compensation function.

12. The MRI apparatus according to claim 11, wherein the gradient controller is further configured to estimate a system characteristic function of the magnetic assembly from measured values of the magnetic field gradients acquired by applying the test gradient waveform and from the actual shape of the applied test gradient waveform.

13. The MRI apparatus according to claim 12, wherein the gradient controller is further configured to calculate the compensation function from the estimated system characteristic function.

14. The MRI apparatus according to claim 12, wherein the measured values of the magnetic field gradients are measured at different time echos (TE).

15. The MRI apparatus according to claim 13, wherein the gradient controller is further configured to calculate an inverse function of the estimated system characteristic function as the compensation function.

16. The MRI apparatus according to claim 13, wherein the gradient controller is further configured to calculate the compensation function by assuming that the actual shape of the applied test waveform is a ramp function having a finite ramp time.

17. The MRI apparatus according to claim 13, wherein the gradient controller is further figured to:

apply the test gradient waveform a plurality of times while varying a shape of the test gradient waveform; and calculate the compensation function using the measured values of the magnetic field gradients according to the shape of the test gradient waveform.

18. The MRI apparatus according to claim 17, wherein the shape of the test gradient waveform is varied based on at least one or more of a polarity, an amplitude, and a ramp time.

19. The MRI apparatus according to claim 13, wherein the gradient controller is further configured to estimate the system characteristic function using the measured values of the magnetic field gradients when the test gradient waveform is not applied and when the test gradient waveform is applied.

20. The MRI apparatus according to claim 13, wherein the gradient controller is further configured to apply the test gradient waveform while varying a polarity of the test gradient waveform.

21. The MRI apparatus according to claim 11, wherein the gradient controller is further configured to calculate the compensation function in directions of the magnetic field gradients corresponding to an X-axis direction, a Y-axis direction, and a Z-axis direction, respectively, and execute pre-emphasis of the gradient waveform in each of the directions.

* * * * *